(12) United States Patent
Schieffer et al.

(10) Patent No.: US 8,357,599 B2
(45) Date of Patent: Jan. 22, 2013

(54) SEED LAYER PASSIVATION

(75) Inventors: Callie A. Schieffer, Kalispell, MT (US); Ismail T. Emesh, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/025,098

(22) Filed: Feb. 10, 2011

(65) Prior Publication Data

US 2012/0205793 A1 Aug. 16, 2012

(51) Int. Cl.
  *H01L 21/20* (2006.01)
(52) U.S. Cl. ........................... 438/584; 438/677
(58) Field of Classification Search .................. 438/584, 438/677
  See application file for complete search history.

(56) References Cited

U.S. PATENT DOCUMENTS

| 6,554,914 B1 | 4/2003 | Rozbicki |
| 7,405,157 B1 | 7/2008 | Reid |
| 7,534,967 B2 | 5/2009 | Kelber |
| 2002/0063062 A1 | 5/2002 | Hymes |
| 2011/0011744 A1 | 1/2011 | Chen |

FOREIGN PATENT DOCUMENTS

KR  10-2010-0024416 A  3/2010

OTHER PUBLICATIONS

International Search Report and Written Opinion mailed Aug. 7, 2012, issued in corresponding International Application No. PCT/US2012/024471, filed Feb. 9, 2012, 11 pages.

*Primary Examiner* — Douglas Menz
(74) *Attorney, Agent, or Firm* — Christensen O'Connor Johnson Kindness PLLC

(57) ABSTRACT

A method of processing a microfeature workpiece generally includes depositing a first conducting layer, at least partially reducing oxides on the first conducting layer to provide a reduced first conducting layer, and exposing the reduced first conducting layer to a substantially oxygen-free environment to provide a passivated first conducting layer. A microfeature workpiece generally includes a first conducting layer, a monolayer directly on the first conducting layer, and a second conducting layer.

21 Claims, 7 Drawing Sheets

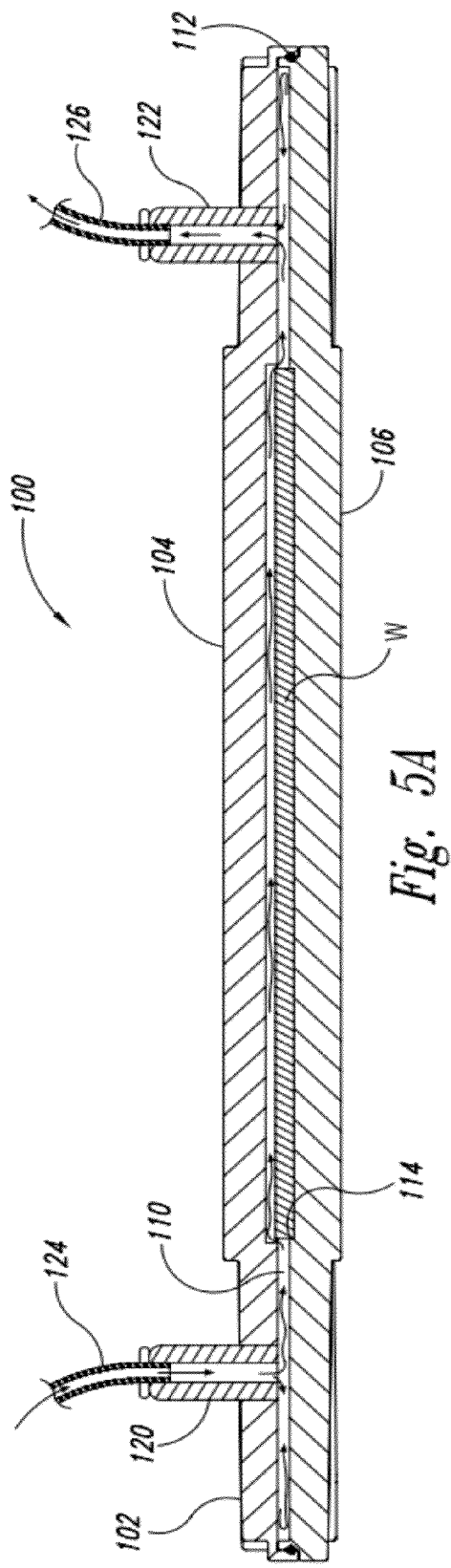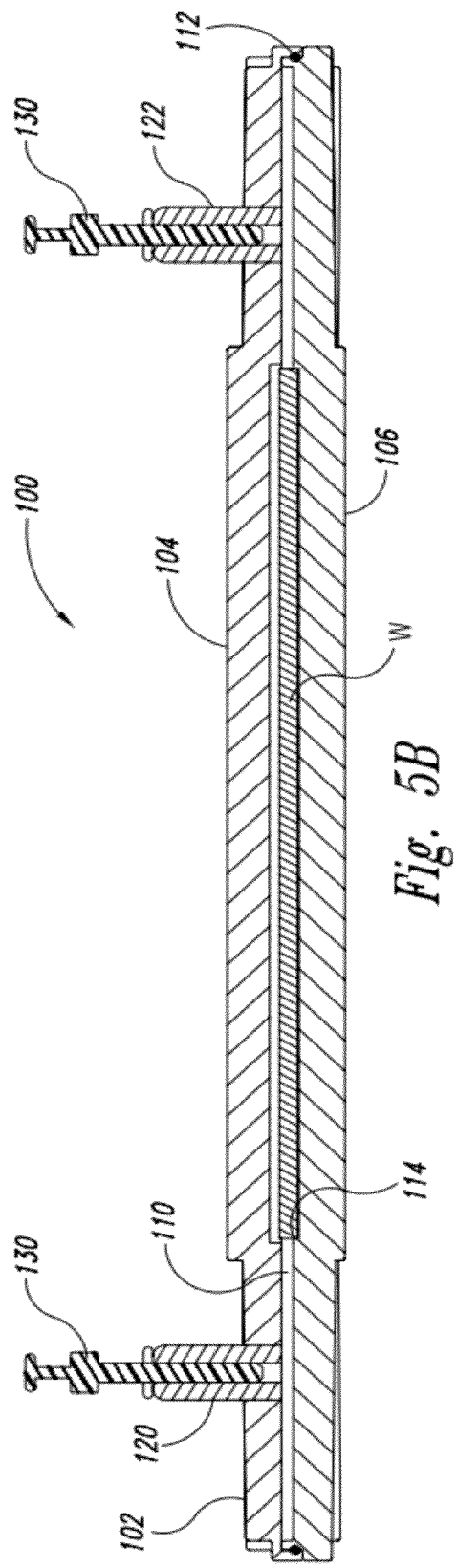

SEED LAYER PASSIVATION

BACKGROUND

In general, semiconductor devices are manufactured by fabrication processes that form electric circuits on a semiconductor substrate, such as a silicon wafer. Metals, like copper, are commonly deposited on the substrate to form the electric circuits. It is well known, however, that copper ions act as a contaminant in semiconductor fabrication. For example, copper ions will diffuse into a silicon substrate and change the conductivity of the silicon. Therefore, a barrier metal layer must completely surround all copper interconnections to prevent the diffusion of copper ions into the surrounding materials. A seed layer is subsequently deposited on the barrier layer to facilitate copper interconnect plating.

Recently, ruthenium has been introduced as a seed layer material to replace commonly used copper seed layers. One drawback of using ruthenium as a seed layer is that it tends to oxidize quickly. The native oxide layer that forms is not an optimal surface for copper plating, particularly for small-sized damascene fill features (such as vias and trenches), for example, features measuring less than 40 nm in width. Therefore, the oxide layer must be reduced prior to initiating copper plating processes. Once reduced, however, oxides will quickly form again.

Therefore, there exists a need for an improved process for passivating a seed layer after oxide reduction to slow the re-oxidation process of the metal seed layer and to enhance metal deposition. There also exists a need for a device for passivating a workpiece and/or containing a workpiece having a passivated seed layer.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a method of processing a microfeature workpiece is provided. The method generally includes depositing a first conducting layer, at least partially reducing oxides on the first conducting layer to provide a reduced first conducting layer, and exposing the reduced first conducting layer to a substantially oxygen-free environment to provide a passivated first conducting layer.

In accordance with another embodiment of the present disclosure, a method of processing a microfeature workpiece is provided. The method generally includes depositing a seed layer, at least partially reducing oxides on the seed layer, after at least partially reducing oxides on the seed layer, placing the workpiece in a hermetically sealed container, and supplying a substantially oxygen-free gas to the container to displace and purge air from the container.

In accordance with another embodiment of the present disclosure, a microfeature workpiece is provided. The workpiece generally includes a first conducting layer, a monolayer including at least a first material directly on the first conducting layer, wherein the first material is selected from the group consisting of nitrogen, sulfur, and mixtures thereof, and a second conducting layer directly on the monolayer.

DESCRIPTION OF THE DRAWINGS

The foregoing aspects and many of the attendant advantages of this disclosure will become more readily appreciated by reference to the following detailed description, when taken in conjunction with the accompanying drawings, wherein:

FIGS. 5A and 5B are cross-sectional views of the device shown in FIG. 7;

DETAILED DESCRIPTION

Figure 1:
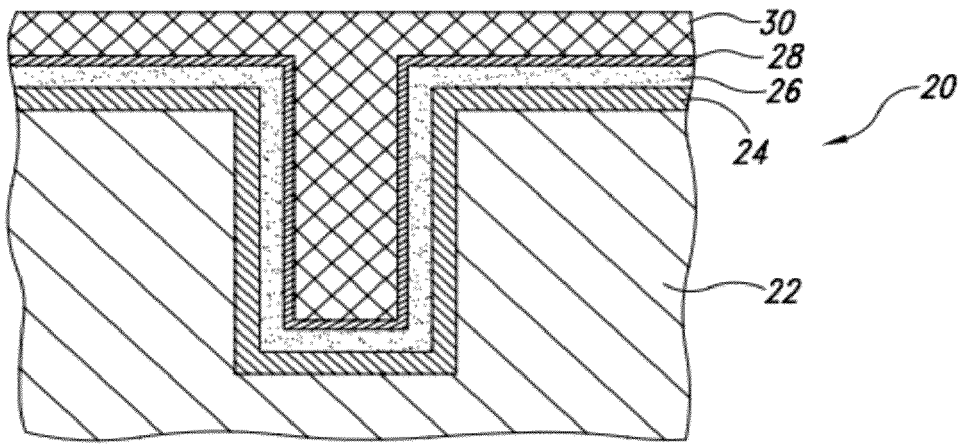
FIG. 1 schematically illustrates a cross-sectional representation of a micro-feature workpiece in accordance with one embodiment of the present disclosure.

Embodiments of the present disclosure are directed to workpieces, such as semiconductor wafers, devices or processing assemblies for processing workpieces, and methods of processing the same. The term workpiece, wafer, or semiconductor wafer means any flat media or article, including semiconductor wafers and other substrates or wafers, glass, mask, and optical or memory media, MEMS substrates, or any other workpiece having micro-electric, micro-mechanical, or microelectro-mechanical devices.

Methods in accordance with the present disclosure are generally directed to methods of forming micro-feature workpieces having improved seed layers. An exemplary workpiece constructed in accordance with methods of the present disclosure may be best understood by referring to FIG. 1. The exemplary workpiece generally includes a substrate 22 having a barrier layer 24, a passivated seed layer (which includes seed layer 26 and monolayer 28) on the barrier layer 24, and a metal layer 30 on the passivated seed layer (26 and 28). In accordance with embodiments of the present disclosure, the seed layer 26 may be a first conducting layer, and the metal layer 30 may be a second conducting layer.

It should be appreciated that the descriptive terms "micro-feature workpiece" and "workpiece" as used herein include all structures and layers that have been previously deposited and formed at a given point in the processing, and is not limited to just those structures and layers as depicted in FIG. 1.

It should further be appreciated that, while the barrier layer 24 of the illustrated embodiment is formed on a substrate 22, as depicted in FIG. 1, barrier layers formed on substrate layers of workpieces are also within the scope of the present disclosure. As non-limiting examples, barrier layers can be formed on gate, source, and drain regions of a workpiece. Accordingly, it should be appreciated that the terms "substrate" and "substrate layer" can be used interchangeably throughout the present disclosure.

Although the exemplary workpiece 20 illustrated in FIG. 1 includes both a barrier layer 24 and a seed layer 26, the barrier layer 24 may be optional. In that regard, it should be appreciated that in accordance with embodiments of the present disclosure, the barrier layer and the seed layer may be combined into one layer. As a non-limiting example, ruthenium may be combined with tantalum to form a combined barrier and seed layer. The barrier characteristics of this example are generally determined by the percentage of tantalum in the tantalum-ruthenium alloy, which is typically from about 1 to about 10 percent. Therefore, in accordance with embodiments of the present disclosure, the first conducting layer of a workpiece may be a combination barrier and seed layer, such as a ruthenium tantalum layer, and the second conducting layer may be a metal layer, such as a copper layer.

As mentioned above, an exemplary workpiece includes a passivated seed layer (26 and 28) (see FIG. 1). It should be appreciated that the descriptive term "passivation" is used herein to represent reduction or prevention of an underlying surface from interaction with materials that are outside the exposed surfaces of the passivating layer. Such passivation can, for example, be a result of the passivating layer preventing physical passage of the undesired materials, and/or by stronger bonding of the passivating layer to the protected surface than would be the bonding with the undesired materials.

It should be appreciated that the term "passivation," as used herein, may also be defined as selective passivation, i.e., a reduction or prevention of the protected surface from interaction with undesired materials, but allowing interaction with desired materials. Suitable selective passivation of a surface may, for example, prevent interaction with oxygen or hydroxides yet allow deposition of metals such as copper.

As described in greater detail below, passivation of the seed layer may be achieved, at least in part, by deposition of a "monolayer" 28 on the seed layer 26. It should be appreciated that the descriptive term "monolayer" is used herein to mean a layer that provides substantially complete coverage of the surface with a passivation layer in an atomic or molecular network that is essentially one atomic or molecular layer thick. In the case of ruthenium passivation, for example, this layer may be formed as a network of molecules that are loosely bound to the underlying metal surface and are bound together on the surface in a structure that does not allow substantial interaction of the substrate with materials such as oxygen or hydroxides but does allow substantial interaction with, for example, electrodepositing metal such as copper.

Figure 2A:
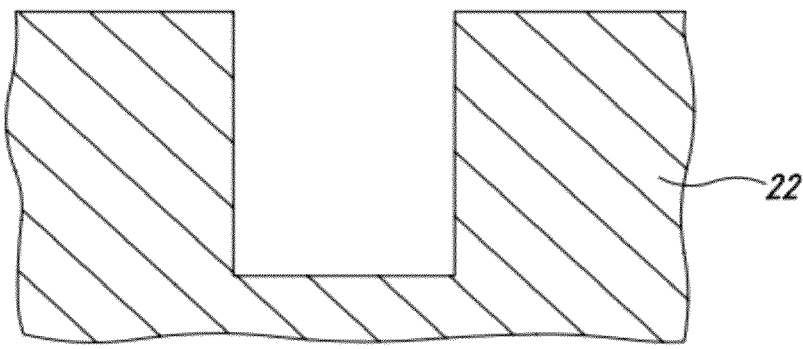
FIGS. 2A-2E schematically illustrate a sequence of steps corresponding to an exemplary method of forming the workpiece of FIG. 1, as described herein.

The workpiece 20 depicted in FIG. 2A, provides a starting point for understanding some of the novel aspects of the disclosure. In that regard, a method of forming a metal layer 30 on a workpiece 20 in accordance with one embodiment of the present disclosure may be best understood by referring to the sequence of steps depicted in FIGS. 2A-2E to produce the workpiece 20 depicted in FIG. 1. The illustrated method generally includes providing a substrate layer 22 (FIG. 2A), depositing a barrier layer 24 on the substrate layer 22 (FIG. 2B), depositing a seed layer 26 on the barrier layer 24 (FIG. 2C), reducing oxides on the seed layer 26 and passivating the exposed surface of the seed layer 26 to provide a passivated seed layer (26 and 28) (FIGS. 2D and 2E), and depositing a metal layer 30 on the passivated seed layer (26 and 28) (FIG. 1).

Figure 2B:
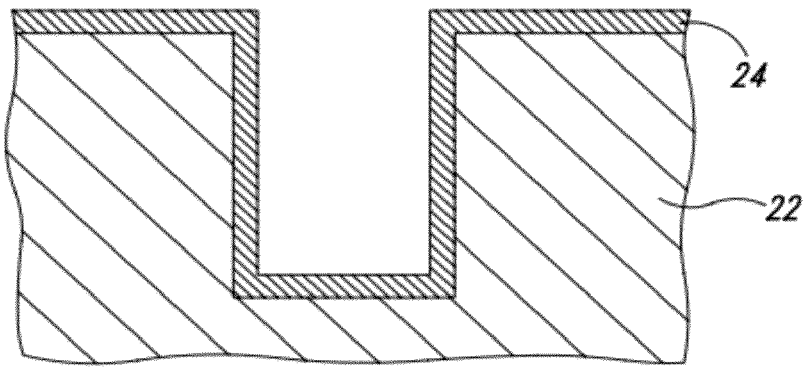

Referring to FIGS. 2A and 2B, deposition of the barrier layer 24 on the substrate layer 22 will now be described in greater detail. The substrate layer 22 may be any suitable substrate layer including, but not limited to, a silicon oxide layer, a silicate layer, a low-K dielectric layer, or an air gap silicon oxide layer. The barrier layer 24 limits metal diffusivity (e.g., copper diffusivity) to chemically isolate a metal conductor 30 (see FIG. 1) from the substrate 22. Suitable barrier layer materials generally have low electrical conductivity, and may include, but are not limited to, tantalum nitride, titanium nitride, manganese, tungsten, tungsten carbide, tungsten nitride, and manganese silicate.

Barrier layers may be formed using physical vapor deposition (PVD), chemical vapor deposition (CVD), atomic layer deposition (ALD), self form, or other known forming technologies. Self form is a method of forming a barrier layer by, for example, first depositing manganese directly on the substrate layer using CVD deposition, then heating the substrate to form manganese silicate. Suitable barrier layers generally have a thickness on average in the range of about 1 to about 4 nanometers in a feature (for example, a via or trench) and less than about 10 nanometers on the field. It should be appreciated, however, that barrier layers generally have thickness variation that might vary above or below these average ranges depending on the manufacturing control parameters for the workpiece and/or the workpiece application.

One drawback of using a barrier layer in a metal plating process is that it is usually difficult to plate metal on typical barrier layer materials. Therefore, an intermediate seed layer is usually required for plating, as described with reference to FIG. 2C below. As described above, a combination seed and barrier layer may also be suitable for plating, in accordance with embodiments of the present disclosure.

In previously developed processes, a copper seed layer was formed, for example, using a PVD process, prior to a copper plating process. Because of PVD process limitations, copper seed layers usually tend to require a certain thickness of at least 2 nanometers to have step coverage on the feature wall and be reliable and effective as seed layers. Such thickness often results in an enhanced overhang at the feature opening. This overhang makes it difficult to electrochemically plate copper using a copper damascene fill process in smaller-sized features, for example, features having a width value on the order of less than about 1 micron, or more preferably, less than about 40 nanometers.

Recently, ruthenium has been introduced as a suitable alternative seed layer material to a copper seed layer. Advantageously, the ruthenium seed layer can be formed by CVD or ALD processes, resulting in a nearly conformal ruthenium layer with a smooth surface. As a result of CVD or ALD formation, the ruthenium seed layer can be much thinner layer than a typical copper seed layer. The thinness of the ruthenium seed layer allows for a larger opening in a feature than the opening for the same feature having a copper seed layer. Suitable ruthenium seed layers generally have a thickness on average in the range of about 1 to about 5 nanometers in a feature, and if deposited by CVD or ALD techniques, then it is expected to have the same thickness on the field. It should be appreciated, however, that seed layers, like barrier layers, generally have thickness variation that might vary above or below these average ranges depending on the manufacturing control parameters for the workpiece and/or the workpiece application.

Figure 2C:
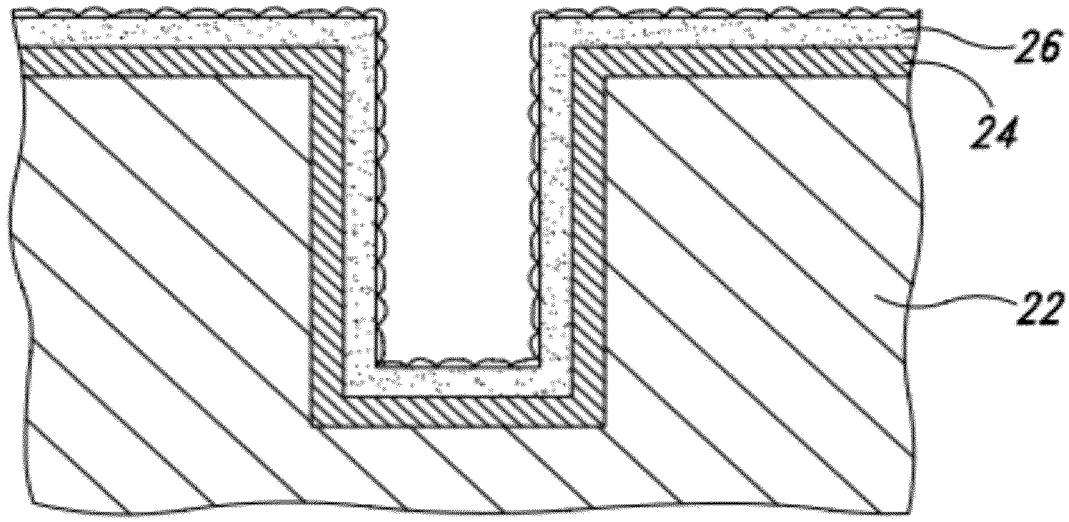

Referring to FIG. 2C, deposition of the seed layer 26 on the barrier layer 24 will be described in greater detail. As a non-limiting example, the seed layer 26 is a ruthenium seed layer formed by either CVD or ALD processes. As seen in FIG. 2C, the seed layer 26 includes a native oxide layer, which forms immediately after deposition. Referring to FIG. 1, it can be seen that metal 30 (e.g., copper) can be electrochemically plated onto a passivated ruthenium seed layer (26 and 28), as described in greater detail below. Copper generally adheres well to ruthenium. Therefore, by depositing a ruthenium seed layer on the barrier layer, copper adhesion is improved and the deposition of a prohibitively thick copper seed layer is not necessary.

One drawback of a ruthenium seed layer, as mentioned above, is that it tends to oxidize quickly, which may result in non-uniform metal (e.g., copper) deposition on the seed layer. Therefore, such oxides must be reduced prior to metal deposition. In order to reduce the oxides, the seed layer 26 is subjected to processes for oxide reduction and subsequent seed layer passivation, as seen in the illustrated embodiment in the series of FIGS. 2D and 2E. Suitable oxide reduction steps may include, but are not limited to, a reducing gas anneal, as described in greater detail in the following paragraph, an electrolytic cleaning process, for example, using a strong acid and an electric charge to reduce the oxide layer, and other suitable processes for providing a substantially fresh metal surface.

Figure 2D:
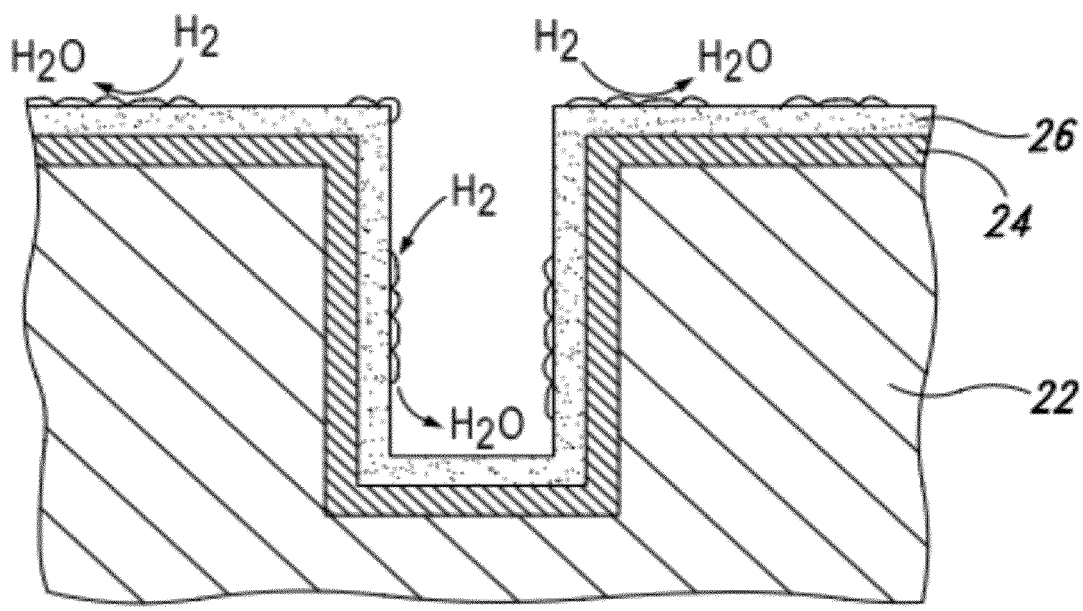

As seen in the illustrated embodiment of FIG. 2D, a non-limiting example of a suitable process for oxide reduction is subjecting the seed layer 26 to an annealing process in the presence of a reducing gas. The reducing gas reduces at least a portion of the oxides that have formed on the metal surface to create a substantially fresh metal surface. One suitable example of a reducing gas is hydrogen. The reducing gas may be mixed with an inert gas (for example, nitrogen, argon, or helium), wherein the reducing gas amount may be in the range of about 2 to about 100 percent of the mixture. As a non-limiting example, the reducing gas may be a mixture of 2% hydrogen and 98% helium. In one suitable oxide reduction process, the reducing gas anneal is performed at a temperature of about 250-400 degrees C. for about 2-5 minutes. The hydrogen in the reducing gas combines with the oxygen in the oxides to form water as a by product of the oxide reduction process.

Figure 2E:
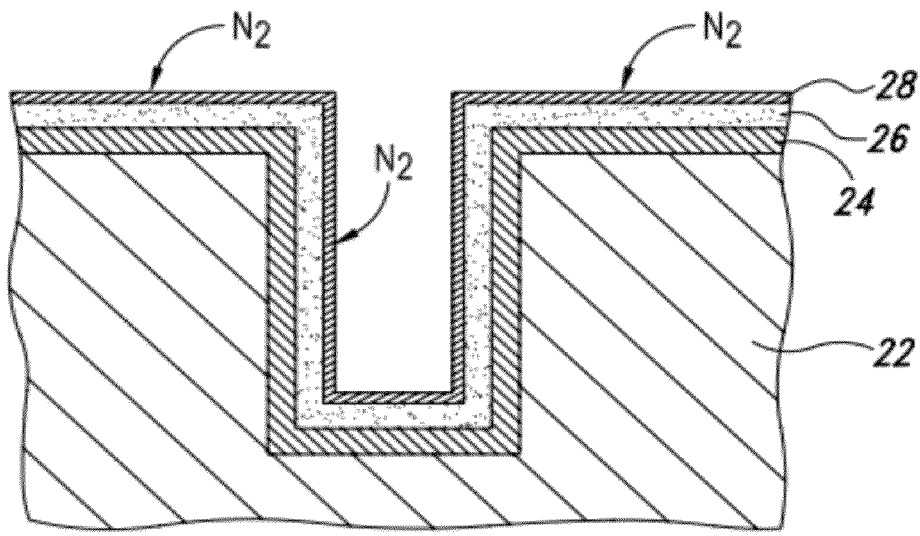

Referring now to FIG. 2E, after native oxide reduction from the seed layer 26 (see FIG. 2E), the reduced seed layer 26 is exposed to a substantially oxygen-free environment, for example, a nitrogen environment, resulting in a passivated seed layer (26 and 28). In that regard, the inventors have found that after oxide reduction, exposure of the reduced surface of the seed layer 26 to a substantially oxygen-free gas reduces the rate of future oxidation of the passivated seed layer and enhances future metal deposition. Notably, the inventors did not have success when the passivation step did not follow the oxide reduction step. In a preferable embodiment, the passivation step immediately follows the oxide reduction step.

In one embodiment of the present disclosure, the substantially oxygen-free environment is a gas substantially comprised of one or more of the following gases of interest: nitrogen, methyl iodide, ammonia, sulfur containing gases, and mixtures thereof. Suitable sulfur containing gases include, but are not limited to, 1-propanethiol, 1-propylmercaptan, 2-propanethiol, and mixtures thereof. The gases of interest need not be present in the gas mixture at 100%. For example, the gases of interest may be suitably combined with a carrier gas, such as one or more inert gases. As a non-limiting example, the substantially oxygen-free environment has an oxygen content in an amount of less than about 1.0 percent, preferably less than about 0.1 percent, and even more preferably, less than about 0.01 percent. In one suitable embodiment, nitrogen bottle gas having a purity of 99.9996% is used for passivation.

The substantially oxygen-free exposure or passivation process may be performed at room temperature, or at any other suitable temperature. In one embodiment, the process temperature is in the range of about 68 degrees C. to about 100 degrees C. to ensure chemisorption of the monolayer on the seed layer. At temperatures above 100 degrees C., strong chemical bonding, as opposed to chemisorption, may occur.

The substantially oxygen-free exposure or passivation process is preferably performed within a short time frame to accommodate typical workpiece processing schedules. In one embodiment, the reduced seed layer 26 is exposed for a time period in the range of about 1 to about 30 minutes. After a certain period of time, for example about 60-90 minutes in the experiments that were performed, the inventors found that metal nucleation may no longer be enhanced, and/or other physical alterations in the seed film may begin to dominate the effects of the passivation gas (for example, nitrogen).

In one embodiment of the present disclosure, the passivation process slows the re-oxidation of the seed layer for a time period in the range of about 6 to about 12 hours after passivation and removal from the substantially oxygen-free environment. In another embodiment of the present disclosure, the passivation process slows the re-oxidation of the seed layer for at least about 12 hours after passivation and removal from the substantially oxygen-free environment.

Sulfur containing gases, such as 1-propanethiol, 1-propylmercaptan, 2-propanethiol, as well as methyl iodide tend to passivate the reduced seed layer more quickly than nitrogen. Therefore, it should be appreciated that, after passivation by any of these gases, the passivated seed layer may be stored in a substantially oxygen-free environment, such as a substantially nitrogen environment, to continue to slow the re-oxidation process of the passivated seed layer.

Although not wishing to be bound by theory, the inventors believe that the seed layer passivation step after the oxide reduction step may result in the formation of an advantageous monolayer 28 formed by chemisorption on the fresh metal surface of the reduced seed layer 26. It is believed that the monolayer 28 is adsorbed onto the fresh metal surface of the seed layer 26 and populates the surface to block interactions between the seed layer 26 and other materials, such as oxygen or hydroxides. The monolayer 28 may include a one or more materials selected from the following group: nitrogen, iodine, molecules containing sulfur, and mixtures thereof.

Notably, the monolayer 28 does not prevent the electrodeposition of metal 30, such as copper, and therefore does not need to be removed prior to the electrodeposition of metal. In addition, in some embodiments, as discussed in greater detail below, the monolayer 28 formed on the fresh metal surface of the seed layer 26 may act like an accelerator during electrochemical deposition processes to enhance the electrodeposition of metal, such as copper.

As a non-limiting example, after the reduction of ruthenium oxides from a ruthenium seed layer, exposure of the seed layer to a substantially nitrogen environment results in the formation of a passivating nitrogen-ruthenium monolayer on the surface of the ruthenium seed layer. As described in the Examples that follow, the data suggest that the nitrogen-ruthenium monolayer inhibits future oxide formation and facilitates dense copper nucleation during the copper electrochemical deposition process. In that regard, the results show that copper deposition is substantially continuous and non-coalesced in the field, and voids are significantly eliminated in copper features formed by damascene fill processes.

As another non-limiting example, exposure to an ammonia gas environment results in the formation of a suitable passivating monolayer. In that regard, ammonia includes a nitrogen atom and therefore forms a passivating monolayer that behaves similarly to the monolayer formed by the nitrogen gas environment. Because ammonia also includes hydrogen, ammonia gas can be used to simultaneously reduce oxides formed on the seed layer and deposit a passivating monolayer. Therefore, in accordance with one embodiment of the present disclosure, the steps of at least partially reducing oxides on the seed layer to provide a reduced seed layer and exposing the reduced seed layer to a substantially oxygen-free environment to provide a passivated seed layer are performed simultaneously using the same gas environment, for example, a gas environment including ammonia.

As another non-limiting example, sulfur containing gases, such as 1-propanethiol, 1-propylmercaptan, 2-propanethiol, and mixtures thereof, not only passivate the seed layer, but also enhance the electrodeposition of metal, such as copper. Regarding enhancement, the sulfur containing gases may behave in a similar manner as an accelerator used in electrodeposition processes. For example, 1-propanethiol has the following chemical structure:

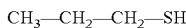

A common accelerator used in the electrodeposition of copper is 3-sodiumsulfopropyldisulfide (SPS), which has the following chemical structure:

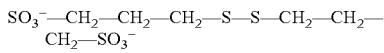

Therefore, exposure of the seed layer to the gas 1-propanethiol has an effect that is similar to exposure to an accelerator in the wet electrochemical deposition processes. The exposure forms a monolayer on the seed layer that has accelerating properties and will draw copper ions to the surface during the electrochemical deposition process to enhance copper plating.

As another non-limiting example, exposure to a methyl iodide environment results in the formation of a suitable passivating monolayer. As described in U.S. Pat. No. 7,534,967, issued to Kelber et al., the disclosure of which is hereby expressly incorporated by reference, iodine vapor may be used to form an iodine selective passivation layer. However, the inventors have found that methyl iodide is more reactive and therefore forms a passivating monolayer with increased delivery and control as compared to iodine vapor. A monolayer formed on the seed layer using methyl iodide also has accelerating properties, similar to the sulfur containing gases, to enhance copper plating.

Returning to FIG. 1, following the seed layer treatment process (see FIGS. 2D and 2E), metal 30 may be electrochemically deposited on the passivated seed layer (26 and 28). As a non-limiting example, one suitable metal is copper. As another non-limiting example, metal is plated using a copper damascene fill process, for example, using an acid plating bath. The workpiece 20 depicted in FIG. 1 shows a substrate layer 22, a barrier layer 24 on the substrate layer 22, a passivated seed layer (26 and 28) on the barrier layer 24, and a metal layer 30 on the passivated seed layer 26, formed by the process steps depicted in FIGS. 2A-2E.

Seed layer treatment in accordance with embodiments of the present disclosure, including oxide reduction and passivation, result in enhanced metal nucleation in metal deposition. In that regard, metal nucleation is densified to provide a more continuous metal deposit at the seed layer interface and minimize voids at the seed layer interface. Moreover, voids in metal damascene fill are also eliminated. In one embodiment of the present disclosure, continuity of the seed layer is improved by about 40 percent. In another embodiment of the present disclosure, passivation eliminated voids in damascene gap fill by 40 percent.

Although methods and embodiments of the present disclosure are illustrated and described with respect to an exemplary ruthenium seed layer, it should be appreciated that other seed layers beside ruthenium are also within the scope of the present disclosure. As non-limiting examples, other suitable seed layers include, but are not limited to, cobalt, other noble metals besides ruthenium, copper alloys, ruthenium alloys, and cobalt alloys.

Further, it is believed that the seed layer treatment and passivation processes described herein for use, for example, with a ruthenium seed layer would also be beneficial when used with a copper seed layer. In that regard, copper seed layers also form oxide layers that inhibit metal deposition, albeit less rapidly than ruthenium seed layers. Copper seed layer treatment and passivation in accordance with the processing methods described herein may have the effect of extending the plating window for subsequent copper plating. The plating window is usually in the range of about 12-24 hours, which is generally considered by the industry to be an acceptable time period for plating interconnect metal on a copper seed layer.

Figure 3:
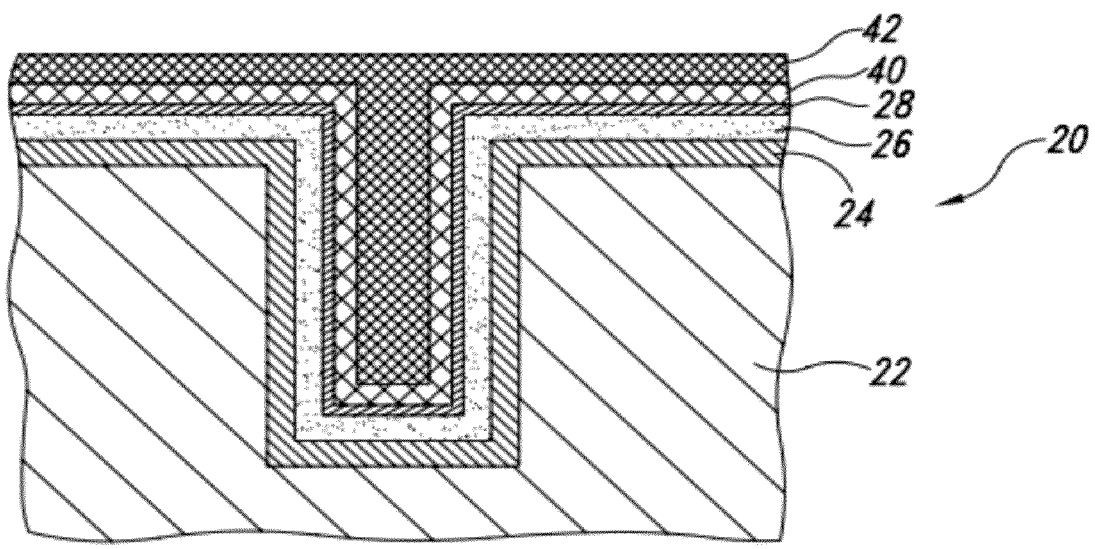
FIG. 3 schematically illustrates a cross-sectional representation of a micro-feature workpiece in accordance with another embodiment of the present disclosure.

Suitable seed layers are generally formed by CVD or PVD processes, but may also be formed by wet seed plating (also known as direct-on-barrier or "DOB" plating) and electroless deposition. Wet seed plating is generally known in the art as a non-traditional plating technique that uses a alkaline plating bath (as opposed to an acidic plating bath) to plate a thin conformal "wet seed" layer of metal before gap filling metal using a traditional acid plating bath. An exemplary workpiece plated using a "wet seed" metal plating process is shown in FIG. 3. The exemplary workpiece generally includes a substrate 22 having a barrier layer 24, a passivated seed layer (26 and 28) on the barrier layer 24, a wet seed metal layer 40 on the passivated seed layer (26 and 28), and a subsequent metal layer 42 plated on the wet seed layer 40. In one embodiment of the present disclosure, the wet seed layer may have a thickness in the range of about 1 to about 5 nanometers.

Device for Passivation

In accordance with another embodiment of the present disclosure, a device 100 for confining the workpiece W and providing a substantially oxygen-free environment will now be described.

Figure 4:
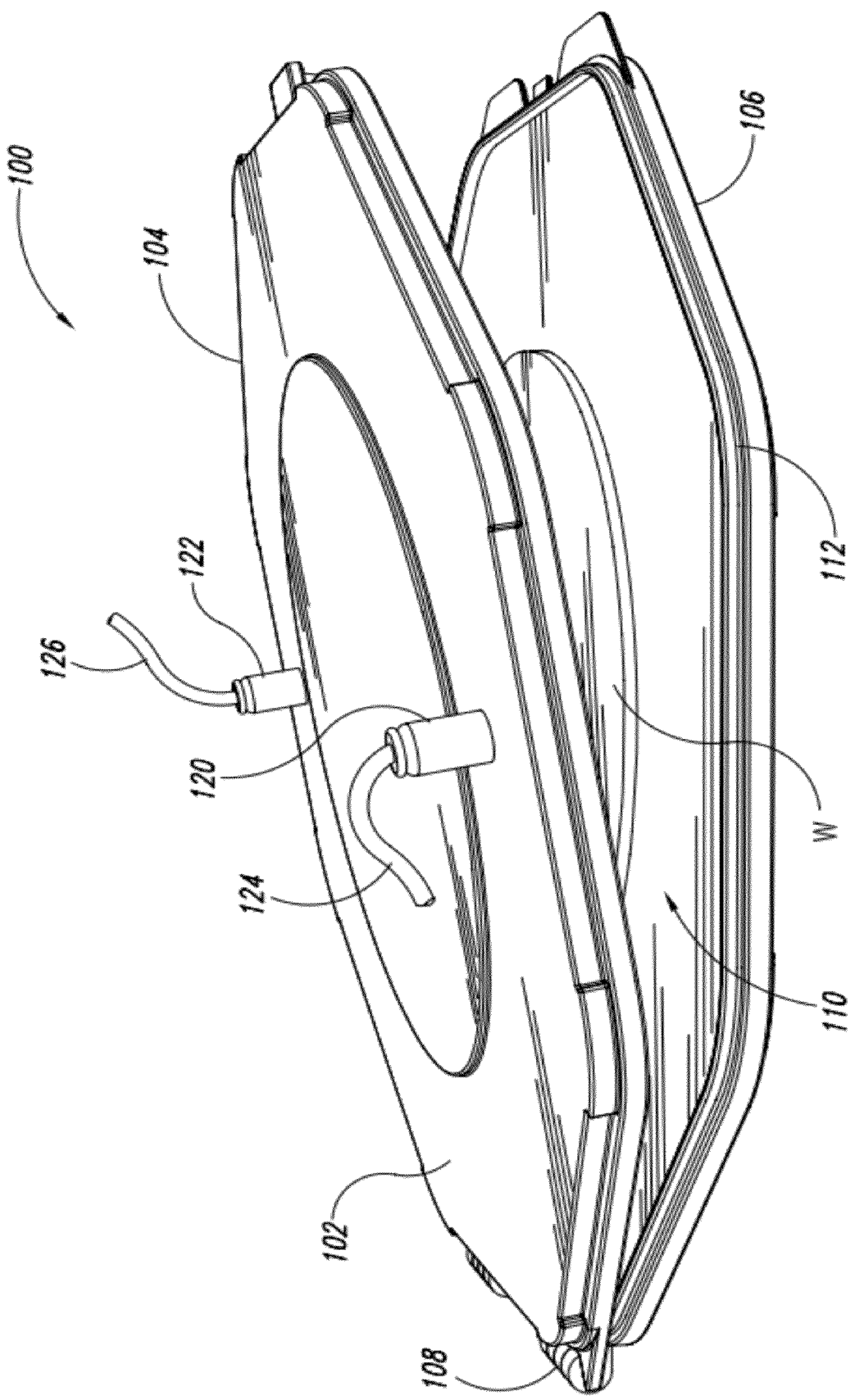
FIG. 4 is a perspective view of a device for processing and/or containing a workpiece in accordance with one embodiment of the present disclosure.

An exemplary device 100 constructed in accordance with methods of the present disclosure may be best understood by referring to FIGS. 4 and 5A and 5B. As best seen FIG. 4, an illustrated embodiment of a portable device 100 is provided. However, it should be appreciated that non-portable devices, for example, for use in a typical workpiece processing sequence, are also within the scope of the present disclosure. A suitable device 100 includes a standard wafer or workpiece carrier, which is designed for protecting a workpiece W during transport. Such workpiece carriers are sealable to prevent dust or particulate matter from contacting the workpiece W. However, they are not configured to provide a substantially oxygen-free gas environment in the inner cavity for treating or exposing the workpiece W.

The device 100 generally includes a housing 102 for receiving and containing a workpiece W, wherein the housing 102 is configured to be purge-able with a gas from a pressurized gas source S. The housing 102 is configured to be positionable in at least open and closed positions (see, respectively, FIGS. 4 and 5A). In that regard, the housing 102 may include first and second housing portions 104 and 106. In the illustrated embodiment, the first housing portion 104 pivots relative to the second housing portion 106 via a hinge 108. As another non-limiting example, the first and second housing portions and may not include a hinge, but rather may be discrete portions that snap together, for example, by interference fit.

The housing 102 is designed such that a workpiece W can be received in the spacing or inner cavity 110 between the first and second housing portions 104 and 106 (see FIGS. 5A and 5B). In that regard, the inner surfaces of the first and/or second housing portions may include grooves 114 sized to receive and hold a workpiece W. The advantage of such grooves is that the workpiece is protected and will not move around in the inner cavity 110 of the housing 102 during transport.

The housing further includes a seal 112 between the first and second housing portions to hermetically seal the inner cavity of the housing. In the illustrated embodiment, the seal extends around the outer perimeter of a rim of the second housing portion 106 and is configured to interface with a rim on the first housing portion 104 when the device 100 is in the closed position (see FIG. 5A). In accordance with embodiments of the present disclosure, the seal 112 is configured to hermetically seal the housing 102 to prevent the passage of gases from the external environment to the internal cavity 110.

As mentioned above, the internal cavity 110 of the housing 102 is configured to be purge-able with a gas from a pressurized source (not shown). In the illustrated embodiment, the device includes two pneumatic valves 120 and 122 in fluid communication with the inner cavity 110 of the housing 102. It should be appreciated that the pneumatic values may be quick connect/disconnect for mating with hoses 124 and 126 from a pressurized gas source (not shown). The first valve 120 is an inlet valve and the second valve 122 is an outlet valve. The fittings of the valves 120 and 122 are preferably sealed to prevent leaking around the fittings.

The first and second valves 120 and 122 are suitable spaced from one another on the device. As seen in FIGS. 4 and 5A, the first and second valves 120 and 122 may be positioned at opposite ends of the device 100. As a result of such a configuration, purge gas is forced to travel though the entire inner cavity 110 of the device 100 between the inlet and the outlet valves 120 and 122, as indicated by flow arrows in FIG. 5A. It should be appreciated that the specific locations of the first and second valves 120 and 122 on the housing 102 may depend upon the purge gas, whether nitrogen or another suitable purge gas. For example, nitrogen is lighter than air; therefore, the first and second valves 120 and 122 should be optimally positioned to ensure that the nitrogen purges all of the air from the inner cavity, and does not merely "float" on top of air that remains in the cavity. The opposite scenario should be considered when the purge gas is heavier than air.

In operation, a workpiece W is placed in the device 100 when the device 100 is in the open orientation (see FIG. 4). The device 100 is closed (see FIG. 5A) and a pressurized gas source (not shown) is attached to the first valve 120, with the second valve being open 122 to create a constant refresh of the source gas. The goal of the device 100 is to purge the air that is present in inner cavity 110 of the device 100 with a substantially oxygen-free gas, such as nitrogen, argon, or other suitable gases described herein. The device 100 is not designed to be pressurized by the purge gas, merely flushed. The device 100 is designed and configured to achieve at least 95% purge of the initial air present in the inner cavity 110.

As seen in FIG. 5B, the valves 120 and 122 can be stoppered with stops 130 when the gas supply is removed and during transport, thus maintaining the desired environment within the cavity 110 of the device 100 and preventing exposure of the contained workpiece W to air.

EXAMPLES

As described in the Examples that follow, copper plating was improved when the ruthenium seed layer was subjected to a reducing gas anneal for oxide reduction and subsequent nitrogen exposure. After such treatment, copper nucleation was enhanced, as described in Example 1, and voids in copper damascene fill were eliminated, as described in Example 3. Prolonged nitrogen exposure will enhance results, as described in Example 2.

Example 1

Enhanced Copper Nucleation

Blanket wafer segment was formed (Samples A, B, C, and D) without structures (trenches and vias) with ruthenium seed layer. Samples B, C, and D were annealed with reducing gas (2% H2 and 98% He) for 2 minutes at 300V. Sample D was transferred to a nitrogen gas purged carrier, where it remained in a nitrogen environment for 90 minutes. A target of 13 nm of copper was attempted by electroplating with typical copper acid plating bath (exposed to air) at a current density of 17.5 mAmp/cm2. Sample surfaces were imaged with a scanning electron microscope (SEM), as shown in FIG. 6.

Figure 6:
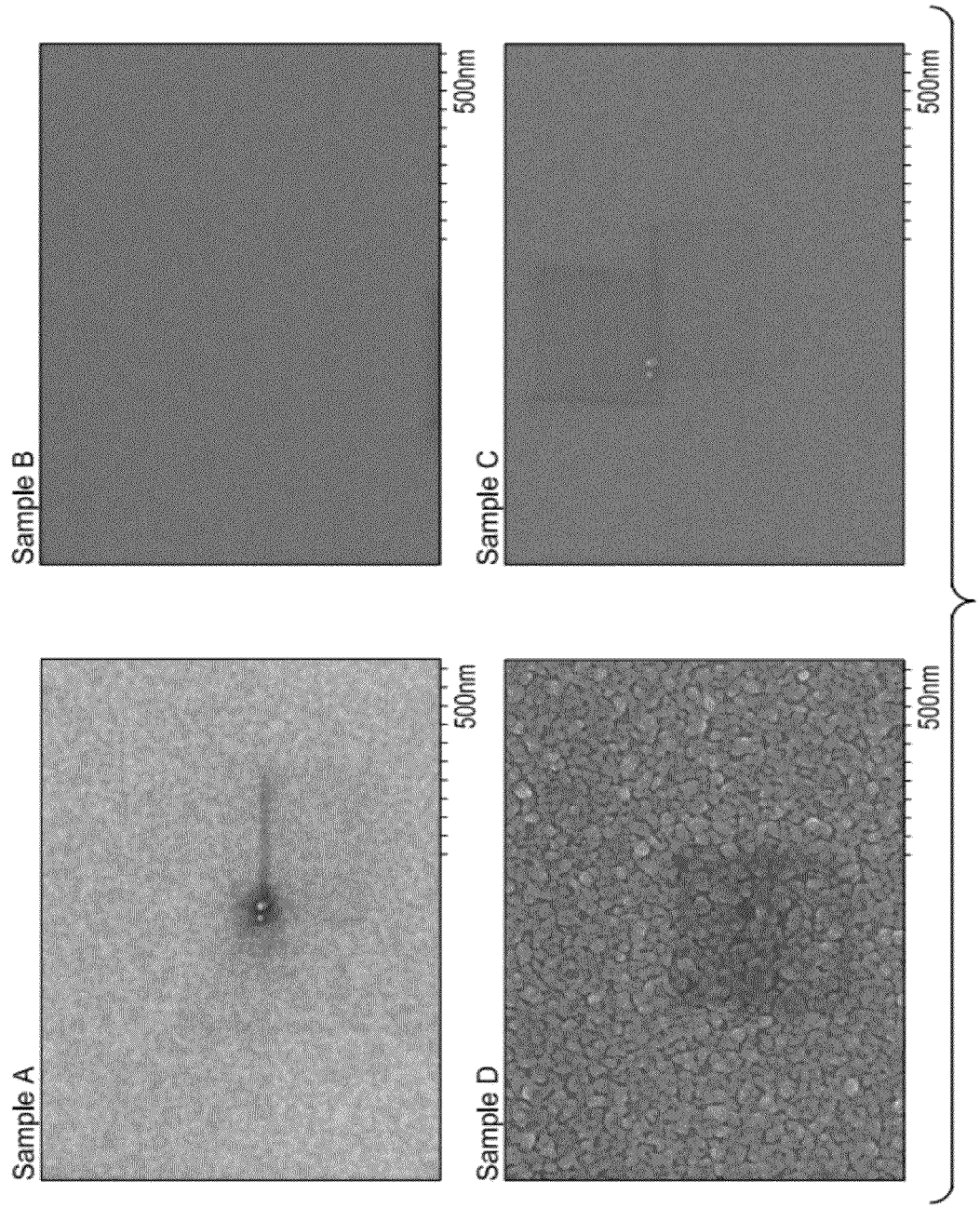
FIG. 6 shows a plurality of scanning electron microscope (SEM) images of various samples showing resultant copper deposition in accordance with embodiments of the present disclosure.

Referring to FIG. 6, the differences between the various samples are shown using SEM images. Sample A was not exposed to annealing or nitrogen gas treatment. The defect at the center of the sample is a single discontinuous, coalesced copper deposit. The inventors estimate that Sample A achieved a plating percentage of less than 5% of the target 13 nm of copper.

Sample B was exposed to the annealing treatment, but not the nitrogen gas treatment, and was plated immediately after the annealing treatment. Sample C also was exposed to the annealing treatment, but not the nitrogen gas treatment, and was plated 90 minutes after the annealing treatment. The images of Samples B and C have a slightly darker color that the image of Sample A because the ruthenium oxide surface film has been reduced. Small white spots seen throughout the images of the Sample B and C surfaces are discontinuous, coalesced copper deposits. The inventors estimate that Samples B and C achieved a plating percentage of less than 10% of the target 13 nm of copper.

Sample D was exposed to both the annealing treatment and the nitrogen gas treatment. The morphology shown in the image of Sample D is copper deposits. Notably, the copper deposits are not coalesced, but rather they deposited in a substantially continuous film. The inventors estimate that Sample D achieved a plating percentage of more than 25% of the target 13 nm of copper, a significant improvement over Samples B and C.

Example 2

Extended Nitrogen Exposure

Blanket wafer segment will be formed (Samples A, B, C, and D) without structures (trenches and vias) with ruthenium seed layer. Samples A, B, C, and D will be annealed with reducing gas (2% H2 and 98% He) for 2 minutes at 300V. Samples A, B, C, and D will be transferred to a nitrogen gas purged carrier, where the samples remain in the nitrogen environment for respective time periods of 15 minutes, 30 minutes, 90 minutes, and 3 hours. Sample results will show that copper nucleation is more consistent across the surface of samples remaining under nitrogen purge for longer periods of time after the reducing gas anneal up to 90 minutes. After a time of about 60-90 minutes, nucleation may no longer be enhanced, and/or other physical alterations in the seed film (such as self-anneal) may begin to dominate the effects of the nitrogen enhancement.

Example 3

Enhanced Copper Damascene Fill

Samples 1-4 were formed as follows: 110 Å PVD ruthenium seed was deposited on a PVD Ta/TaN barrier, which was deposited on a substrate with trenches. Samples 1-4 were passivated by reducing gas (2% H2 and 98% He) anneal at 300V for 2 minutes. Sample B was placed in a nitrogen gas environment for 90 minutes. Copper was plated on Samples A and B in NP5200 acid copper plating bath in a Raideftool.

Figure 7:
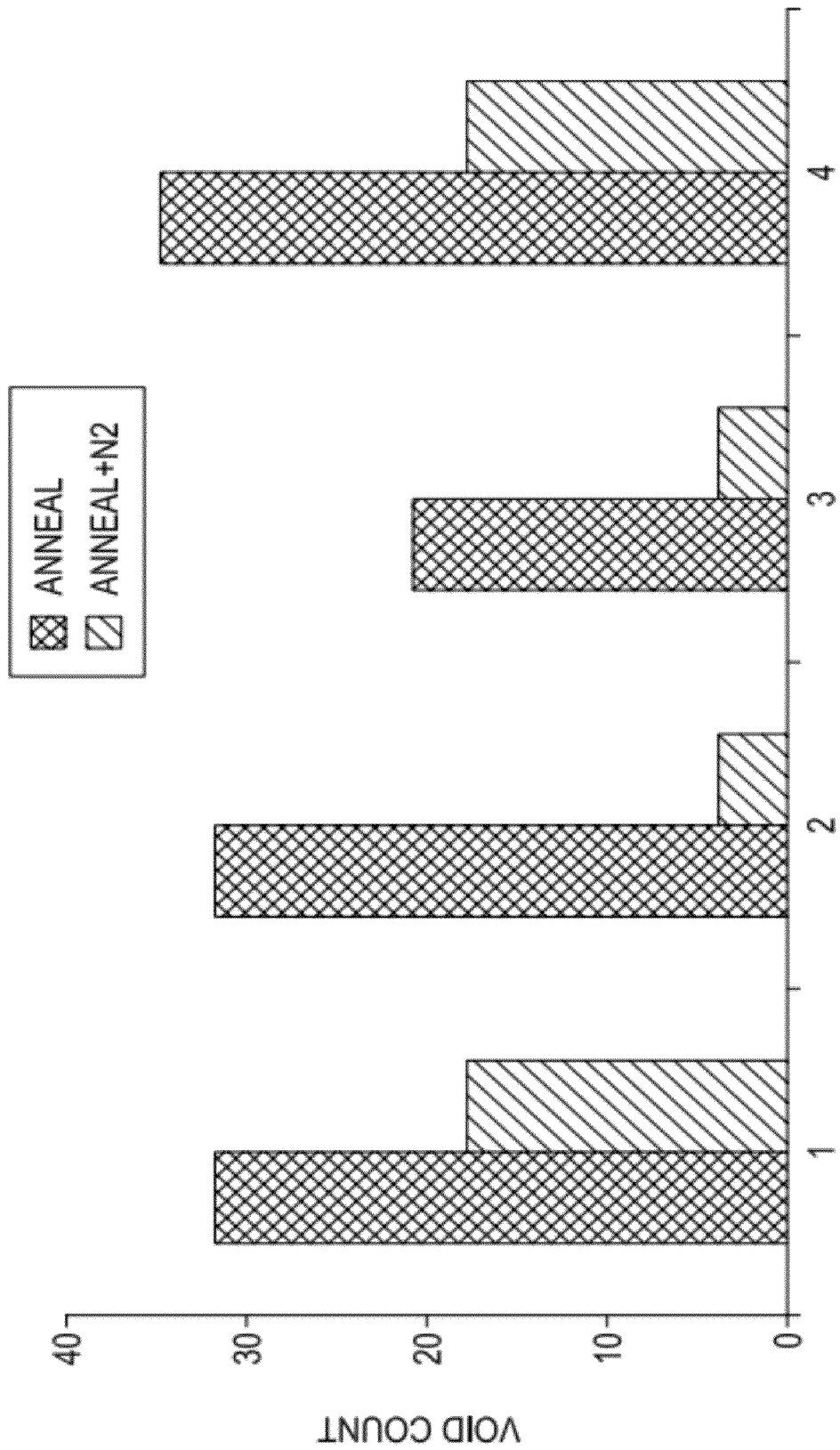
FIG. 7 is a bar graph showing void elimination results in copper damascene deposition processes in accordance with embodiments of the present disclosure.

Referring to FIG. 7, the differences between the samples are shown using a bar graph. In general, the voids in the copper damascene fill are reduced by at least 40% in Sample B (subjected to nitrogen exposure), as compared to Sample A (not subjected to nitrogen exposure).

Various embodiments of the present disclosure are described below.

In accordance with one embodiment of the present disclosure, a method of processing a microfeature workpiece generally includes depositing a first conducting layer on a workpiece, at least partially reducing oxides on the first conducting layer to provide a reduced first conducting layer, and exposing the reduced first conducting layer to a substantially oxygen-free environment to provide a passivated first conducting layer.

In accordance with another embodiment of the present disclosure, a microfeature workpiece generally includes a first conducting layer, a monolayer including at least a first material directly on the first conducting layer, wherein the first material is selected from the group consisting of nitrogen, sulfur and mixtures thereof, and a second conducting layer directly on the monolayer.

In accordance with another embodiment of the present disclosure, a method of processing a microfeature workpiece generally includes depositing a seed layer on the workpiece, at least partially reducing oxides on the seed layer to provide a reduced seed layer, and exposing the reduced seed layer to a substantially oxygen-free environment to provide a passivated seed layer.

In accordance with another embodiment of the present disclosure, a method of processing a microfeature workpiece generally includes depositing a seed layer, at least partially reducing oxides on the seed layer, after at least partially reducing oxides on the seed layer, placing the workpiece in a hermetically sealed container, and supplying a substantially oxygen-free gas to the container to displace and purge air from the container.

In accordance with another embodiment of the present disclosure in any of the methods or workpieces described herein, the first conducting layer is a seed layer.

In accordance with another embodiment of the present disclosure in any of the methods or workpieces described herein, the seed layer includes a metal selected from the group consisting of ruthenium, copper, cobalt, other noble metals besides ruthenium, copper manganese, copper alloys, ruthenium alloys, and cobalt alloys.

In accordance with another embodiment of the present disclosure in any of the methods or workpieces described herein, the substantially oxygen-free environment is substantially comprised of a gas selected from the group consisting of nitrogen, methyl iodide, ammonia, sulfur containing gases, and mixtures thereof.

In accordance with another embodiment of the present disclosure in any of the methods or workpieces described herein, the sulfur containing gases are selected from the group consisting of 1-propanethiol, 1-propylmercaptan, 2-propanethiol, and mixtures thereof.

In accordance with another embodiment of the present disclosure in any of the methods or workpieces described herein, exposing the first conducting layer to a substantially oxygen-free environment reduces the rate of future oxidation of the passivated first conducting layer.

In accordance with another embodiment of the present disclosure in any of the methods or workpieces described herein, exposing the first conducting layer to a substantially oxygen-free environment enhances future metal deposition.

In accordance with another embodiment of the present disclosure in any of the methods or workpieces described herein, exposing the first conducting layer to a substantially oxygen-free environment forms a monolayer on the first conducting layer.

In accordance with another embodiment of the present disclosure in any of the methods or workpieces described herein, the monolayer acts as an accelerator to enhance copper plating.

In accordance with another embodiment of the present disclosure in any of the methods or workpieces described herein, the passivated first conducting layer includes a monolayer on the surface of the reduced first conducting layer comprising a first material selected from the group consisting of nitrogen, sulfur, and mixtures thereof.

In accordance with another embodiment of the present disclosure in any of the methods or workpieces described herein, further comprising depositing a barrier layer on the workpiece prior to depositing the first conducting layer. In any of the methods or workpieces described herein, the barrier layer is deposited on a substrate.

In accordance with another embodiment of the present disclosure in any of the methods or workpieces described herein, further comprising depositing a second conducting layer on the passivated first conducting layer.

In accordance with another embodiment of the present disclosure in any of the methods or workpieces described herein, the second conducting layer includes copper.

In accordance with another embodiment of the present disclosure in any of the methods or workpieces described herein, depositing the second conducting layer on the passivated first conducting layer is performed using a damascene fill process.

In accordance with another embodiment of the present disclosure in any of the methods or workpieces described herein, further comprising depositing a wet seed layer on the passivated first conducting layer, then depositing a second conducting layer on the wet seed layer using a damascene fill process.

In accordance with another embodiment of the present disclosure in any of the methods or workpieces described herein, exposing the first conducting layer to a substantially oxygen-free environment includes placing the workpiece in a device, sealing the device, and purging the device with a substantially oxygen-free environment.

In accordance with another embodiment of the present disclosure in any of the methods or workpieces described herein, the steps of at least partially reducing oxides on the first conducting layer to provide a reduced first conducting layer and exposing the reduced first conducting layer to a substantially oxygen-free environment to provide a passivated first conducting layer are performed simultaneously using the same gas environment.

While illustrative embodiments have been illustrated and described, it will be appreciated that various changes can be made therein without departing from the spirit and scope of the disclosure.

The embodiments of the disclosure in which an exclusive property or privilege is claimed are defined as follows:

1. A method of processing a microfeature workpiece, the method comprising:
   (a) depositing a first conducting layer;
   (b) at least partially reducing oxides on the first conducting layer to provide a reduced first conducting layer; and
   (c) exposing the reduced first conducting layer to a substantially oxygen-free environment to provide a treated first conducting layer, wherein the substantially oxygen-free environment is selected from the group consisting of substantially pure nitrogen and an environment containing vaporized 1-propanethiol, 1-propylmercaptan, 2-propanethiol, or mixtures thereof.

2. The method of claim 1, wherein the first conducting layer is a seed layer.

3. The method of claim 2, wherein the seed layer includes a metal selected from the group consisting of ruthenium, copper, cobalt, other noble metals besides ruthenium, copper manganese, copper alloys, ruthenium alloys, and cobalt alloys.

4. The method of claim 1, wherein exposing the first conducting layer to a substantially oxygen-free environment reduces the rate of future oxidation of the treated first conducting layer.

5. The method of claim 1, wherein exposing the first conducting layer to a substantially oxygen-free environment enhances future metal deposition.

6. The method of claim 1, wherein exposing the first conducting layer to a substantially oxygen-free environment forms a chemisorbed layer on the first conducting layer.

7. The method of claim 6, wherein the chemisorbed layer acts as an accelerator to enhance copper plating.

8. The method of claim 1, wherein the treated first conducting layer includes a chemisorbed layer on the surface of the reduced first conducting layer.

9. The method of claim 1, further comprising depositing a barrier layer on the workpiece prior to depositing the first conducting layer.

10. The method of claim 9, wherein the barrier layer is deposited on a substrate.

11. The method of claim 1, further comprising depositing a second conducting layer on the treated first conducting layer.

12. The method of claim 11, wherein the second conducting layer includes copper.

13. The method of claim 11, wherein depositing the second conducting layer on the treated first conducting layer is performed using a damascene fill process.

14. The method of claim 1, further comprising depositing a wet seed layer on the treated first conducting layer, then depositing a second conducting layer on the wet seed layer using a damascene fill process.

15. The method of claim 1, wherein exposing the first conducting layer to a substantially oxygen-free environment includes placing the workpiece in a device, sealing the device, and purging the device with a substantially oxygen-free environment.

16. The method of claim 1, wherein the substantially pure nitrogen environment has a concentration of nitrogen gas selected from the group consisting of 99%, 99.9%, 99.99%, and 99.9996%.

17. The method of claim 1, wherein treated first conducting layer acts as an accelerating layer to accelerate the deposition of metal.

18. A method of processing a microfeature workpiece, the method comprising:
   (a) at least partially reducing oxides on a first conducting layer to provide a reduced first conducting layer; and
   (b) adsorbing atoms to the reduced first conducting layer from a substantially oxygen-free environment, wherein the substantially oxygen-free environment is selected from the group consisting of substantially pure nitrogen environment and an environment containing vaporized 1-propanethiol, 1-propylmercaptan, 2-propanethiol, or mixtures thereof.

19. A method of processing a microfeature workpiece, the method comprising:
   (a) at least partially reducing oxides on a first conducting layer to provide a reduced first conducting layer;
   (b) adsorbing a chemisorbed layer of atoms to the reduced first conducting layer from a substantially oxygen-free environment; and
   (c) plating metal directly on the chemisorbed layer.

20. The method of claim 19, wherein the first conducting layer is a seed layer.

21. The method of claim 20, wherein the workpiece further includes a barrier layer under the seed layer.

* * * * *

UNITED STATES PATENT AND TRADEMARK OFFICE
CERTIFICATE OF CORRECTION

PATENT NO. : 8,357,599 B2
APPLICATION NO. : 13/025098
DATED : January 22, 2013
INVENTOR(S) : C. A. Schieffer et al.

It is certified that error appears in the above-identified patent and that said Letters Patent is hereby corrected as shown below:

In the Specification

| COLUMN | LINE | ERROR |
|---|---|---|
| 4 | 42 | before "much thinner" insert --a-- |
| 8 | 22 | "a alkaline" should read --an alkaline-- |
| 8 | 43 | "seen FIG. 4," should read --seen in FIG. 4,-- |
| 8 | 65 | after "housing portions" delete "and" |
| 9 | 30 | "suitable spaced" should read --suitably spaced-- |
| 9 | 34 | "travel though" should read --travel through-- |
| 10 | 16 | "300V." should read --300°C.-- |
| 10 | 59 | "300V." should read --300°C-- |
| 11 | 13 | "300V." should read --300°C-- |
| 11 | 15 | "Raideftool" should read --Raider® tool-- |

Signed and Sealed this
Fifteenth Day of April, 2014

Michelle K. Lee
*Deputy Director of the United States Patent and Trademark Office*

CERTIFICATE OF CORRECTION (continued)
U.S. Pat. No. 8,357,599 B2

In the Claims

| COLUMN | LINE | ERROR |
|---|---|---|
| 14<br>(Claim 17, line 1) | 19 | after "wherein" insert --the-- |